United States Patent [19]

Nowak

[11] 4,282,544
[45] Aug. 4, 1981

[54] ENCAPSULATED HYBRID CIRCUIT ASSEMBLY

[75] Inventor: Robert A. Nowak, Mesa, Ariz.

[73] Assignee: Motorola Inc., Schaumburg, Ill.

[21] Appl. No.: 51,610

[22] Filed: Jun. 25, 1979

Related U.S. Application Data

[63] Continuation of Ser. No. 859,424, Dec. 12, 1977, abandoned.

[51] Int. Cl.³ .................. H01L 23/28; H01L 23/16; H01L 23/02
[52] U.S. Cl. ........................ 357/72; 357/70; 357/75; 357/80; 357/81
[58] Field of Search ................ 357/70, 71, 72, 74, 357/75, 80, 81

[56] References Cited

U.S. PATENT DOCUMENTS

| 3,439,255 | 4/1969  | Carnes et al.   | 357/80 |
| 3,469,148 | 9/1969  | Lund            | 357/80 |
| 3,500,440 | 3/1970  | Hastings        | 357/75 |
| 3,544,857 | 12/1970 | Byrne et al.    | 357/70 |
| 3,793,474 | 2/1974  | Dunn            | 357/70 |
| 3,839,660 | 10/1974 | Stryker         | 357/71 |
| 3,958,075 | 5/1976  | Kaufman         | 357/80 |
| 4,066,839 | 1/1978  | Cossutta et al. | 357/72 |
| 4,092,487 | 5/1978  | Imai            | 357/72 |
| 4,128,801 | 12/1978 | Gansert et al.  | 357/75 |

OTHER PUBLICATIONS

RCA Technical notes; by Greig, Tune Stage Assembly Technique for Semiconductor Devices, Apr. 1968, pp. 1 and 2.
Hybrid Assembly Time Reduced With Purpose-Designed Chips; Electronics Engineering, by Jordan; Jun. 1972, pp.58-61.

Primary Examiner—Andrew J. James

[57] ABSTRACT

A hybrid circuit including IC chips and discrete components wherein a substrate is connected to a lead frame and the lead frame is utilized for securing and positioning the substrate during the mounting and electrical connecting of IC chips and discrete components thereon. Once the entire circuit is connected the lead frame is utilized for securing and positioning the substrate in a transfer mold to encapsulate the substrate with epoxy or the like. In the present invention a pair of matching substrates having interconnected circuits thereon are constructed simultaneously and formed into two interconnected packages which can be tested before or after mounting in a receiving structure. Further, repairs may be made to the final assembly without destruction thereof, since the "component like" circuit package can be replaced without affecting other parts in the system.

3 Claims, 6 Drawing Figures

ENCAPSULATED HYBRID CIRCUIT ASSEMBLY

This is a continuation of application Ser. No. 859,424, filed Dec. 12, 1977, now abandoned.

BACKGROUND OF THE INVENTION

The present invention pertains to a hybrid package including IC chips and discrete components and to the manufacture thereof. In all hybrid packages presently known to the inventor, IC chips are mounted on a special substrate and encapsulated or hermetically sealed, after which the encapsulated or hermetically sealed chip is mounted and connected on to a substrate, or printed circuit board, of a hybrid system. The remaining components are then affixed to the system, external leads are attached thereto and the hybrid system is then inserted into a receiving structure and, generally, the entire receiving structure is filled with an encapsulating material to fixedly mount and protect the hybrid circuit. This method of mounting and encapsulating hybrid circuits is extremely unsatisfactory because the circuit cannot be tested until it is encapsulated in the receiving structure and, if a single connecting lead is improperly attached the entire structure must be disposed of. Further, the amount of labor involved in connecting the IC chips and discrete components is extensive because all of the connections must be made by hand.

SUMMARY OF THE INVENTION

The present invention pertains to an improved hybrid package and method of manufacture, wherein a substrate constructed to receive IC chips and discrete components is electrically and mechanically connected to a lead frame, which lead frame is then utilized for securing and positioning the substrate so that IC chips and discrete components can be connected thereto automatically by machines and the like and the substrate with the components attached thereto is then placed in a transfer mold and encapsulated in a structure having a predetermined shape and size so that the encapsulated hybrid package can be positioned in a receiving structure with little or no need for additional mounting or positioning means and the encapsulating stucture provides sufficient protection and mounting structure for the hybrid circuit.

It is an object of the present invention to provide a new and improved hybrid package and method of manufacture thereof.

It is a further object of the present invention to provide a hybrid package wherein a hybrid circuit including IC chips and discrete components is encapsulated with a minimum of effort and the package can be tested and mounted without risking the loss of cooperating circuits and structures.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures.

DESCRIPTION OF THE PREFERRED EMBODIMENT

Figure 1:
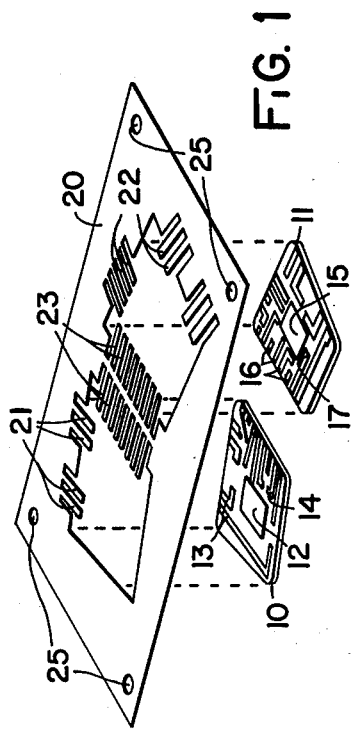
Figure 2:
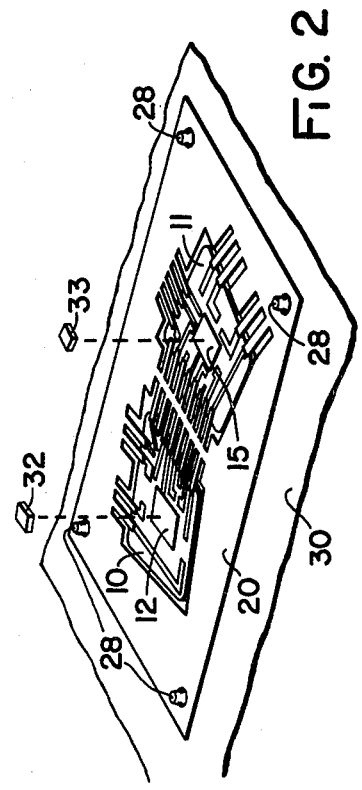

Referring specifically to FIG. 1, a first substrate 10 and a second substrate 11 are illustrated. The substrate 10 has a mounting pad 12, a plurality of connecting pads 13 and artwork 14 for attaching discrete components thereto, deposited thereon. Similarly, substrate 11 has a mounting pad 15, a plurality of connecting pads 16 and artwork 17 for connecting discrete components thereto, deposited thereon. A lead frame 20 is provided with a first plurality of leads 21 adapted to be connected to the connecting pads 13 of the first substrate 10, a second plurality of leads 22 adapted to be connected to the connecting pads 16 of the second substrate 11 and interconnecting leads 23 adapted to be connected between connecting pads 13 and connecting pads 16 of the first and second substrates 10 and 11. Once the substrates 10 and 11 are properly attached to all of the leads 21, 22 and 23, the substrates 10 and 11 are precisely positioned relative to a plurality of alignment holes 25 in the lead frame 20.

Figure 3:
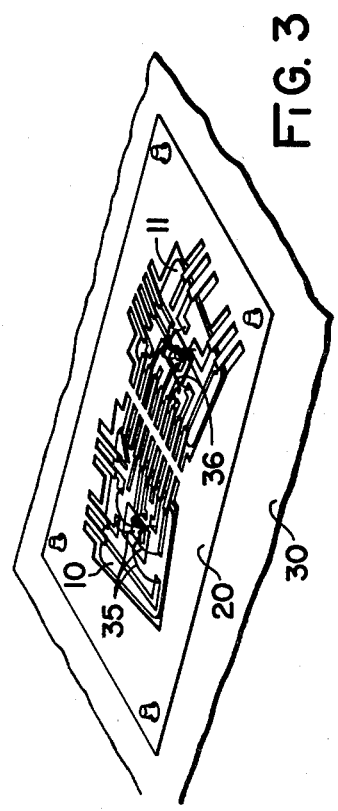

With the substrates 10 and 11 electrically and mechanically connected to the lead frame 20, the alignment holes 25 are utilized to secure and position the lead frame 20 so that the substrates 10 and 11 are precisely positioned and secured for subsequent assembly steps. For example, in the present embodiment the lead frame 20 is securely mounted and positioned by means of four upstanding mounting pegs 28 positioned to engage the alignment holes 25 and securely hold and position the lead frame 20 and substrates 10 and 11. The pegs 28 are affixed to machinery 30 which is generally designed to automatically perform a series of steps, including bonding IC chips 32 and 33 to mounting pads 12 and 15, respectively, and to make electrical connections between the IC chips 32 and 33 and the circuitry on the substrates 10 and 11, respectively. Also, the machinery automatically connects discrete components 35 and 36 on the substrates 10 and 11, respectively, as illustrated in FIG. 3. Because the substrates 10 and 11 are precisely positioned relative to the machinery 30 and secured thereto by the alignment holes 25 and pins 28, the machinery 30 can perform all of the above-described operations automatically and the costly and laborious manual connections required by the prior art are eliminated. While alignment holes 25 and pins 28 are illustrated in the present embodiment, it should be understood that other means for securing and positioning the lead frame 20 might be utilized, such as precisely located edges thereof which could then be placed in abutting engagement with shoulders on the machinery 30.

With the substrates 10 and 11 electrically and mechanically connected to the lead frame 20, the IC chips 32 and 33 mounted on the substrates 10 and 11 and the various electrical connections and discrete components connected into the circuitry to complete the hybrid system, the substrates 10 and 11 are ready for encapsulation. The lead frame 20 is removed from the machinery 30 and placed in a transfer mold 40. In this embodiment a matched metal transfer mold is utilized having a pair of internal cavities 41 and 42 defined therein for receiving the substrates 10 and 11, respectively. Encapsulating material, such as epoxy or the like, is injected into the transfer mold 40 to completely surround and encapsulate both of the substrates 10 and 11. The metal transfer mold 40 is used to provide a hybrid package having a relatively low tolerance, for example, in the present embodiment the tolerance is approximately plus or minus 3 mils.

Figure 4:
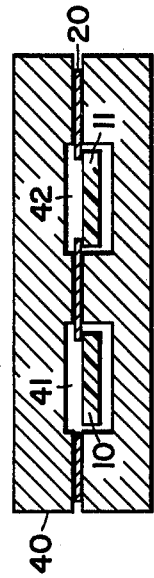
FIGS. 1-6 illustrate the various steps of manufacture of a hybrid package incorporating the present invention.
Figure 5:
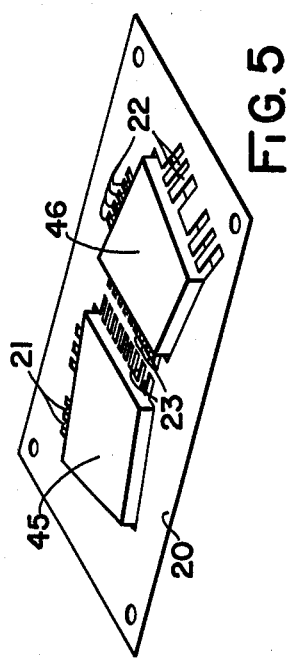
Figure 6:
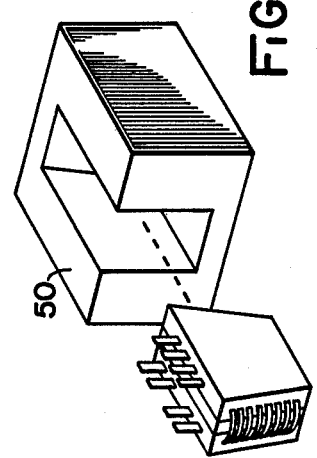

The completed hybrid package, illustrated in FIG. 5, includes a first encapsulating structure 45 and a second encapsulating structure 46, containing the substrates 10 and 11, respectively. The encapsulating structures 45 and 46 are now removed from the lead frame 20 to provide a complete hybrid package with external leads 21 and 22 and interconnecting leads 23 ruggedly attached thereto and the entire structure having a predetermined shape and size such that it can be accurately and easily mounted in a receiving structure 50. In this embodiment the structures 45 and 46 are similar, each being constructed with two major surfaces joined by four edges. The leads 21, 22 and 23 eminate from the edges with all of the interconnecting leads 23 eminating from a single edge in each structure. Further, the leads 23 are long enough to allow bending thereof to position the major sides of the structures 45 and 46 parallel. It will be understood by those skilled in the art that bending the interconnecting leads 23 to position the structures in any other noncoplanar configuration appropriate to any particular application would be encompassed by the structure described above. A third structure 47 is positioned between the structures 45 and 46, and the entire assembly fits exactly into an opening 51 in the structure 50.

The hybrid package can be tested prior to mounting in the receiving structure 50 or it can be tested after mounting in the receiving structure 50, if desired. In either case, if a failure, poor connection, etc. occurs the hybrid package may be removed and/or repaired, if possible, and/or a new hybrid package may be substituted therefor without ruining the entire structure 50. Because the size and shape of the hybrid package is relatively precise, the receiving structure 50 can be constructed with a relatively precise cavity for receiving the hybrid package so that the package will be mounted with a minimum of movement and a maximum of structural support without requiring the hybrid circuit to be encapsulated into the structure 50, as in the prior art. Thus, assembly, testing and maintenance or repair are greatly simplified by the present structure.

While I have shown and described a specific embodiment of this invention, further modifications and improvements will occur to those skilled in art. I desire it to be understood, therefore, that this invention is not limited to the particular form shown and I intend in the appended claims to cover all modifications which do not depart from the spirit and scope of this invention.

What is claimed is:

1. An integrated circuit assembly comprising:
 (a) a plurality of nonconducting substrates, at least one of said substrates being disposed in a noncoplanar configuration with respect to at least one other of said substrates;
 (b) conducting layers on said substrates comprising a plurality of connecting pads and artwork for attaching discrete components thereto forming an integral part thereof;
 (c) at least one discrete component attached to said artwork;
 (d) a lead frame comprising external leads, attached to said substrates for transmission of signals into and out of the assembly, and at least one interconnecting lead mechanically and electrically connecting said at least one of said substrates to said at least one other of said substrates, said at least one interconnecting lead being bent to dispose said at least one substrate and said at least one other substrate in a noncoplanar configuration; and
 (e) means for encapsulating said substrates, said at least one discrete component and at least portions of said lead frame, said means for encapsulating being placed to allow noncoplanar disposition of said substrates.

2. The integrated circuit assembly according to claim 1 wherein said artwork comprises at least one mounting pad and said at least one discrete component comprises at least one IC chip attached to said at least one mounting pad.

3. The integrated circuit assembly according to claim 1 wherein said means for encapsulating comprises embedding material precisely formed into structures of a predetermined size and shape, said at least one interconnecting lead being bent to juxtapose said structures for insertion into a cavty of precise size and shape.

* * * * *